(12) United States Patent
Toyoda et al.

(10) Patent No.: US 10,818,476 B2
(45) Date of Patent: Oct. 27, 2020

(54) SUBSTRATE PROCESSING APPARATUS

(71) Applicant: HITACHI KOKUSAI ELECTRIC INC., Tokyo (JP)

(72) Inventors: Kazuyuki Toyoda, Toyama (JP); Naofumi Ohashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 583 days.

(21) Appl. No.: 15/696,220

(22) Filed: Sep. 6, 2017

(65) Prior Publication Data

US 2018/0226228 A1    Aug. 9, 2018

(30) Foreign Application Priority Data

Feb. 6, 2017  (JP) ................. 2017-019514

(51) Int. Cl.
*H01J 37/32* (2006.01)
*C23C 16/52* (2006.01)
(Continued)

(52) U.S. Cl.
CPC ...... *H01J 37/32183* (2013.01); *C23C 16/458* (2013.01); *C23C 16/50* (2013.01);
(Continued)

(58) Field of Classification Search
CPC ............ H01J 31/32183; H01J 37/3271; H01J 37/3211; H01J 37/32449; H01J 2237/332;
(Continued)

(56) References Cited

U.S. PATENT DOCUMENTS

| 5,556,501 A | 9/1996 | Collins et al. |
| 6,444,137 B1 | 9/2002 | Collins et al. |

(Continued)

FOREIGN PATENT DOCUMENTS

| JP | 5-206072 A | 8/1993 |
| JP | 2002-043304 A | 2/2002 |

(Continued)

OTHER PUBLICATIONS

Taiwanese Office Action dated Dec. 12, 2018 for the Taiwanese Patent Application No. 106139262.
(Continued)

*Primary Examiner* — Yuechuan Yu
(74) *Attorney, Agent, or Firm* — Volpe and Koenig, P.C.

(57) ABSTRACT

There is provided a substrate processing apparatus which includes: a processing container in which a substrate is accommodated; a substrate supporting part configured to support the substrate inside the processing container and including a support electrode; an upper electrode installed to face the substrate supporting part; a first impedance control
(Continued)

part having one end connected to the upper electrode; a second impedance control part having one end connected to the support electrode; a processing gas supply part configured to supply a processing gas to the substrate; an activation part configured to activate the processing gas, the activation part being installed outside the processing container and being connected to a power supply part via an insulating part; and a third impedance control part having one end connected between the insulating part and the activation part.

15 Claims, 9 Drawing Sheets

(51) Int. Cl.

| | | |
|---|---|---|
| *C23C 16/50* | (2006.01) | |
| *C23C 16/458* | (2006.01) | |
| *C23C 16/509* | (2006.01) | |
| *C23C 16/56* | (2006.01) | |
| *H01L 21/67* | (2006.01) | |

(52) U.S. Cl.
CPC .......... *C23C 16/5096* (2013.01); *C23C 16/52* (2013.01); *C23C 16/56* (2013.01); *H01J 37/3211* (2013.01); *H01J 37/32449* (2013.01); *H01J 37/32715* (2013.01); *H01L 21/6719* (2013.01); *H01J 37/32458* (2013.01); *H01J 2237/332* (2013.01); *H01L 21/67017* (2013.01)

(58) Field of Classification Search
CPC .... H01J 37/32458; C23C 16/56; C23C 16/50; C23C 16/458; C23C 16/5096; C23C 16/52; H01L 21/6719; H01L 21/67017
See application file for complete search history.

(56) References Cited

U.S. PATENT DOCUMENTS

| | | |
|---|---|---|
| 9,431,220 B1 | 8/2016 | Ohashi et al. |
| 2003/0097984 A1 | 5/2003 | Nakano et al. |
| 2010/0317199 A1 | 12/2010 | Horie et al. |
| 2015/0093913 A1 | 4/2015 | Toyoda et al. |
| 2016/0276183 A1 | 9/2016 | Ohashi et al. |
| 2016/0293500 A1 | 10/2016 | Ohashi et al. |

FOREIGN PATENT DOCUMENTS

| | | | |
|---|---|---|---|
| JP | 2003-273035 A | | 9/2003 |
| JP | 2012-193457 A | | 10/2012 |
| JP | 2015-092533 A | | 5/2015 |
| JP | 2016-176129 A | | 10/2016 |
| JP | 2017-017274 A | | 1/2017 |
| KR | 20070097232 A | | 10/2007 |
| TW | 201639003 A | | 11/2016 |
| TW | 201705332 A | | 2/2017 |

OTHER PUBLICATIONS

Korean Office Action dated Mar. 14, 2019 for the Korean Patent Application No. 10-2017-0133312.

Japanese Office Action dated Feb. 6, 2019 for the Japanese Patent Application No. 2017-019514.

FIG. 8

Impedance setting table

| | Impedance value of first impedance control part [arbitrary unit] | Impedance value of second impedance control part [arbitrary unit] | Impedance value of third impedance control part [arbitrary unit] |
|---|---|---|---|
| First setting, ion-less | 10 | 100 | 10 |
| Second setting, ions poor | 30 | 30 | 10 |
| Third setting, ions rich | 100 | 10 | 10 |

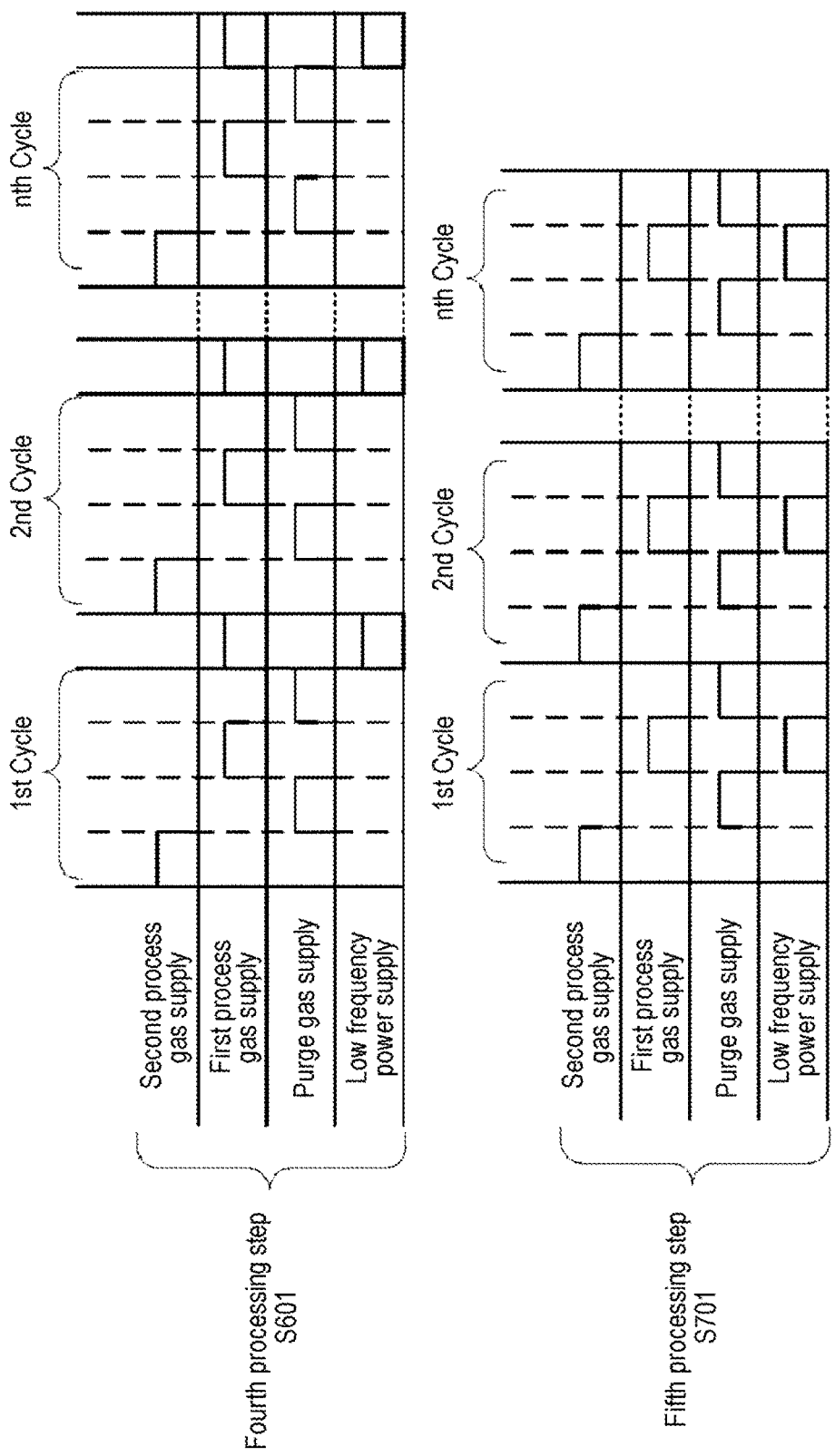

SUBSTRATE PROCESSING APPARATUS

CROSS-REFERENCE TO RELATED APPLICATION

This application is based upon and claims the benefit of priority from Japanese Patent Application No. 2017-019514, filed on Feb. 6, 2017, the entire contents of which are incorporated herein by reference.

TECHNICAL FIELD

The present disclosure relates to a substrate processing apparatus.

BACKGROUND

With higher integration of semiconductor devices represented by LSI (Large Scale Integrated circuit), DRAM (Dynamic Random Access Memory), Flash Memory and the like, miniaturization of circuit patterns and structures formed in a manufacturing process have advanced. In a process of manufacturing a semiconductor device, a plasma-based process is used as a process for realizing such miniaturization.

Such a plasma-based process is also used to change the characteristics of a processed film.

There is a need to improve the characteristics of a substrate after performing a process of changing the characteristics of a film.

SUMMARY

Some embodiments of the present disclosure provide a technique for improving the characteristics of a substrate after performing a process of changing the characteristics of a film.

According to one embodiment of the present disclosure, there is provided a substrate processing apparatus, including: a processing container in which a substrate is accommodated; a substrate supporting part configured to support the substrate inside the processing container and including a support electrode; an upper electrode installed to face the substrate supporting part; a first impedance control part having one end connected to the upper electrode; a second impedance control part having one end connected to the support electrode; a processing gas supply part configured to supply a processing gas to the substrate; an activation part configured to activate the processing gas, the activation part being installed outside the processing container and being connected to a power supply part via an insulating part; and a third impedance control part having one end connected between the insulating part and the activation part.

BRIEF DESCRIPTION OF DRAWINGS

FIG. 8 illustrates an example of an impedance setting table according to one embodiment.

FIG. 9 illustrates an example of a processing sequence according to another embodiment.

DETAILED DESCRIPTION

Embodiments of the present disclosure will be now described in detail with reference to the drawings.

One Embodiment

Hereinafter, one embodiment of the present disclosure will be described with reference to the drawings.

(1) Configuration of Substrate Processing Apparatus

First, a substrate processing apparatus according to one embodiment of the present disclosure will be described.

A substrate processing apparatus 100 according to the present embodiment will be described. The substrate processing apparatus 100 is, for example, an insulating film forming unit and is configured as a single-wafer-type substrate processing apparatus as illustrated in FIG. 1.

Figure 1:
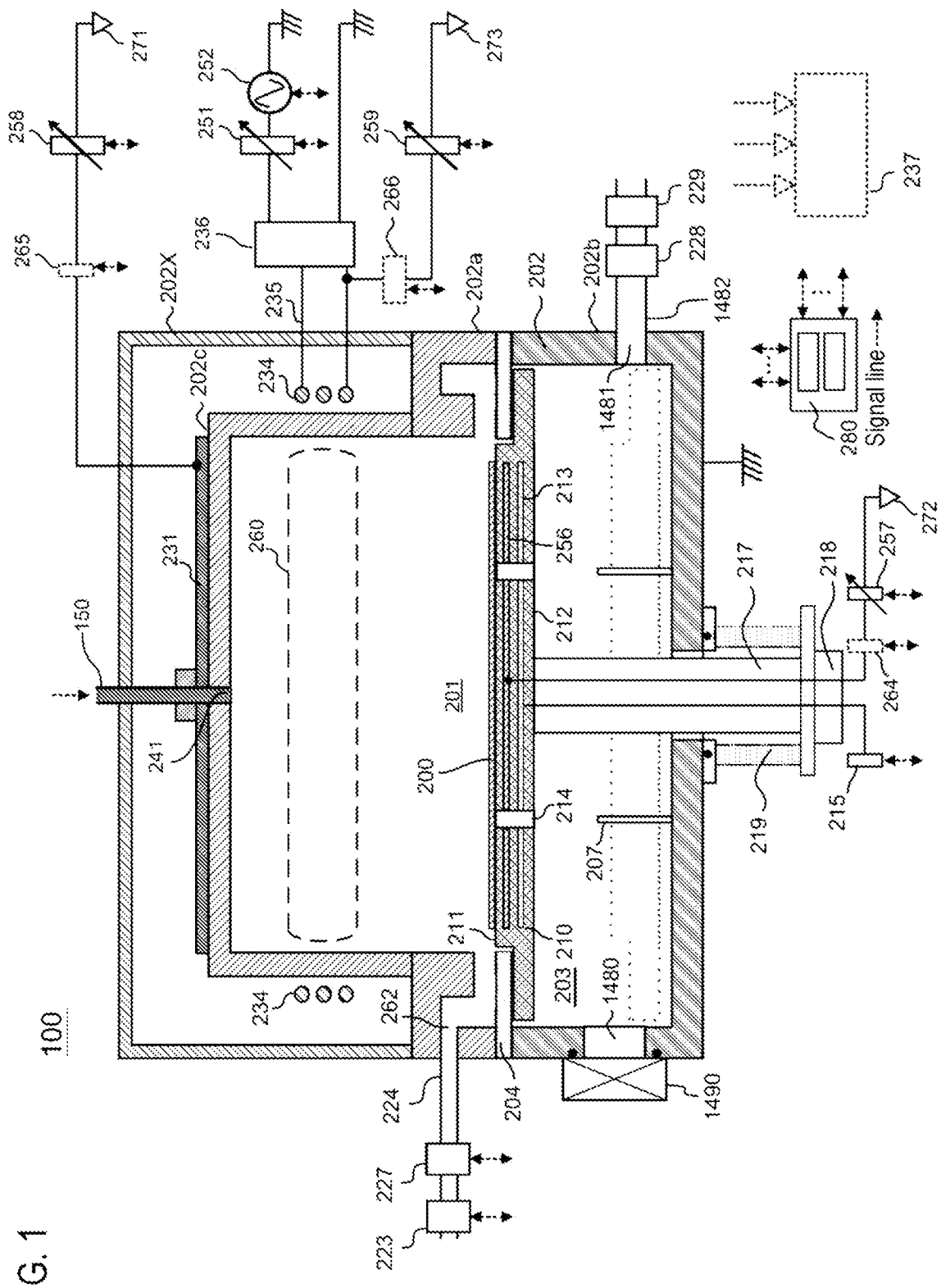
FIG. 1 is a schematic view illustrating the configuration of a substrate processing apparatus according to one embodiment.

As illustrated in FIG. 1, the substrate processing apparatus 100 includes a processing container 202. The processing container 202 is, for example, configured as a flat airtight container having a horizontal circular cross section. Further, the processing container 202 is made of a metal material such as aluminum (Al) or stainless steel (SUS), or quartz. A process space 201 in which a wafer 200 such as a silicon wafer as a substrate is processed, and a transfer space (transfer chamber) 203 are formed inside the processing container 202. The processing container 202 is composed of an upper container 202a, a lower container 202b and a plasma generation container 202c. The plasma generation container 202c is installed above the upper container 202a. A partition member 204 is installed between the upper container 202a and the lower container 202b. A space surrounded by the upper container 202a and the plasma generation container 202c above the partition member 204 is referred to as the process space 201. A space surrounded by the lower container 202b below the partition member 204 is referred to as the transfer chamber 203.

A substrate loading/unloading port 1480 adjacent to a gate valve 1490 is installed in the side surface of the lower container 202b. The wafer 200 is moved between a transfer module (not shown) and the transfer chamber 203 via the substrate loading/unloading port 1480. A plurality of lift pins 207 is installed in the bottom portion of the lower container 202b. The lower container 202b is grounded.

A substrate supporting part 210 for supporting the wafer 200 is installed inside the process space 201. The substrate supporting part 210 mainly includes a substrate mounting table 212 having a mounting surface 211 on which the wafer 200 is mounted, and a heater 213 as a heating part. Through-holes 214 through which the lift pins 207 penetrate are formed in the substrate mounting table 212 at positions corresponding to the lift pins 207, respectively. Further, a support electrode 256 is installed in the substrate mounting table 212. The support electrode 256 is connected to a second impedance control part 257. By adjusting a second impedance of the second impedance control part 257, the potential of the wafer 200 or the lower side (the wafer 200 side) of the process space 201 can be adjusted. One end of the second impedance control part 257 is connected to an arbitrary potential. For example, one end of the second impedance control part 257 is connected to one of an earth potential, a second potential portion 272 having a potential different from the earth potential, and a common potential portion 237. A switching part 264 may be installed between the support electrode 256 and the second impedance control part 257 so as to make electrical disconnection between the support electrode 256 and the second impedance control part 257.

The substrate mounting table 212 is supported by a shaft 217. The shaft 217 penetrates through the bottom portion of the processing container 202 and is connected to an elevating part 218 installed outside the processing container 202. The wafer 200 mounted on the substrate mounting surface 211 can be raised and lowered by actuating the elevating part 218 to move the shaft 217 and the substrate mounting table 212 up and down. In addition, the periphery of the lower end portion of the shaft 217 is covered with a bellows 219 so that the interior of the process space 201 is air-tightly kept.

When the wafer 200 is transferred, the substrate mounting table 212 is moved to a wafer transfer position indicated by a broken line inside the transfer chamber 203 in FIG. 1. When the wafer 200 is subjected to a first process, the substrate mounting table 212 is moved to a first process position (wafer process position) indicated by a solid line in FIG. 1. The wafer transfer position corresponds to a position at which the tips of the lift pins 207 protrude from the upper surface of the substrate mounting surface 211.

Specifically, when the substrate mounting table 212 is lowered to the wafer transfer position, the tips of the lift pins 207 protrude from the upper surface of the substrate mounting surface 211 so that the lift pins 207 support the wafer 200 from below. In addition, when the substrate mounting table 212 is raised to the wafer process position, the lift pins 207 are moved downward from the upper surface of the substrate mounting surface 211 so that the substrate mounting surface 211 supports the wafer 200 from below. Since the lift pins 207 make direct contact with the wafer 200, the lift pins 207 may be made of, for example, a material such as high purity quartz or high purity alumina.

(Exhaust System)

A first exhaust port 262 as a first exhaust part for exhausting an internal atmosphere of the process space 201 is formed in the process space 201 (the upper container 202a). An exhaust pipe 224 is connected to the first exhaust port 262. A pressure regulator 227 such as an APC (Auto Pressure Controller) or the like for controlling the interior of the process space 201 to have a predetermined pressure, and a vacuum pump 223 are connected in series to the exhaust pipe 224 in this order. A first exhaust system (exhaust line) is mainly constituted by the first exhaust port 262, the exhaust pipe 224 and the pressure regulator 227. The vacuum pump 223 may also be included in the first exhaust system. A second exhaust port 1481 for exhausting an internal atmosphere of the transfer chamber 203 is formed in the side surface of the inner wall of the transfer chamber 203. An exhaust pipe 1482 is installed in the second exhaust port 1481. A pressure regulator 228 such as an APC or the like for controlling the interior of the transfer chamber 203 to have a predetermined pressure, and a vacuum pump 229 are connected in series to the exhaust pipe 1482 in this order. A second exhaust system (exhaust line) is mainly constituted by the second exhaust port 1482, the exhaust pipe 1482 and the pressure regulator 228. The vacuum pump 229 may also be included in the second exhaust system. The pump 229 may be configured in common with the above-described vacuum pump 223.

(Gas Introduction Port)

A gas introduction port 241 through which various gases are introduced into the process space 201 is formed in an upper portion of the process space 201. The configuration of each gas supply unit connected to the gas introduction port 241, which is one component of a processing gas supply part, will be described later.

(Activating Part (Plasma Generating Part))

An electrode 234 as an activating part is installed outside the plasma generation container 202c. The electrode 234 is configured to generate an inductively-coupled plasma 260. Specifically, the electrode 234 is an antenna and is composed of a coil whose length may not become $(\lambda/4) \times n$ ($\lambda$: wavelength of a supplied low frequency, n: an even number). This length is a length at which standing waves are unlikely to occur in at least one of the coil and the process space 201. This length may be shorter than $(\lambda/4) \times n$. With this configuration, it is possible to eliminate the non-uniformity of a plasma density distribution caused by a local concentration of plasma. An insulating part 236 is connected to the electrode 234 via a feed line 235. The insulating part 236 is a structure for insulating from a reference potential (earth) of a low frequency power supply 252. The insulating part 236 is constituted by, for example, an insulating transformer. A matching device 251 and the low frequency power supply 252, which constitute a power supply part, are connected to the insulating part 236. An electromagnetic wave (low frequency power) can be supplied to the electrode 234 via the low frequency power supply 252, the matching device 251 and the insulating part 236. As a result, a gas supplied into the process space 201 can be activated (plasmarized). The activating part is constituted by at least the electrode 234. As used herein, the low frequency power refers to power having a frequency of 0.1 MHz or more and 2 MHz or less.

An upper electrode (also referred to as a ceiling electrode or a lid electrode) 231 is installed on the plasma generation container 202c. The upper electrode 231 is installed at a position facing the wafer 200 and is connected with a first impedance control part 258. By adjusting a first impedance of the first impedance control part 258, the plasma state in the vicinity of the upper electrode 231 can be adjusted. One end of the first impedance control part 258 is connected to an arbitrary potential. For example, one end of the first impedance control part 258 is connected to one of an earth potential, a first potential portion 271 having a potential different from the earth potential, and the common potential portion 237. A switching part 265 may be installed between the upper electrode 231 and the first impedance control part 258 so as to make electrical disconnection between the upper electrode 231 and the first impedance control part 257.

A third impedance control part 259 is connected between the electrode 234 and the insulating part 236. By adjusting a third impedance of the third impedance control part 259, the plasma state inside the process space 201 can be adjusted. One end of the third impedance control part 259 is connected to an arbitrary potential. For example, one end of the third impedance control part 259 is connected to one of an earth potential, a third potential portion 273 having a potential different from the earth potential, and the common potential portion 237. A switching part 266 may be installed between the third impedance control part 259, the electrode 234 and the insulating part 236 so as to make electrical disconnection between them. Further, the first potential portion 271, the second potential portion 272 and the third potential portion 273 described above may be configured to have different potentials or may be configured to have the same potential.

(Gas Supply Parts)

A gas supply pipe 150 is connected to the gas introduction port 241. A first gas, a second gas and a purge gas, which will be described later, are supplied from the gas supply pipe 150. The processing gas supply part is constituted by the gas introduction port 241 and at least one of a first gas supply part, a second gas supply part and an inert gas supply part which will be described later.

Figure 2:
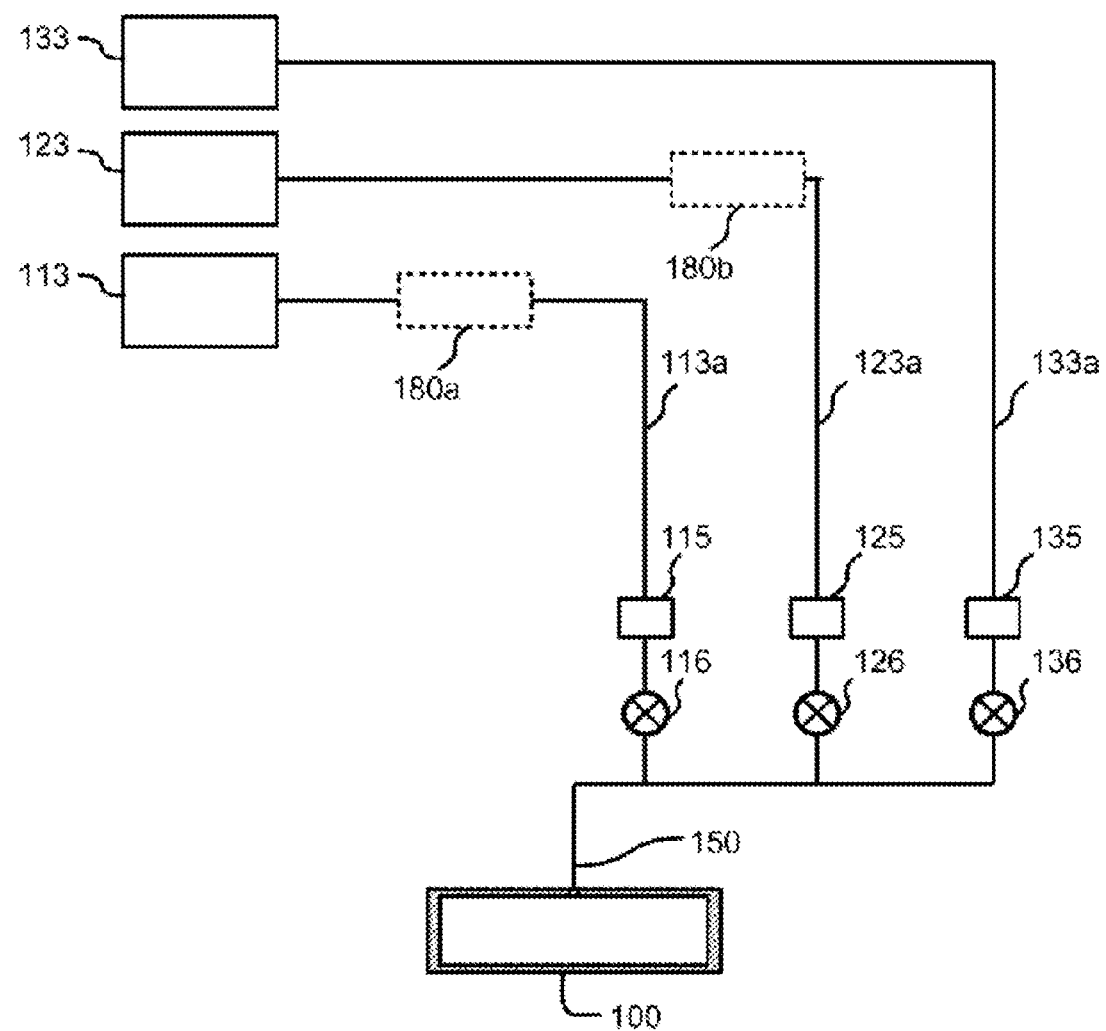
FIG. 2 is a schematic view illustrating the configuration of gas supply parts according to one embodiment.

FIG. 2 is a schematic view illustrating the configuration of gas supply parts such as the first gas supply part, the second gas supply part and the inert gas supply part.

As illustrated in FIG. 2, a first gas (first processing gas) supply pipe 113a, a second gas (second processing gas) supply pipe 123a and an inert gas supply pipe 133a are connected to the gas supply pipe 150.

(First Gas Supply Part)

The first gas supply part includes the first gas supply pipe 113a, a mass flow controller (MFC) 115 and a valve 116. A first gas supply source 113 connected to the first gas supply pipe 113a may be included in the first gas supply part. When a precursor of the first processing gas is liquid or solid, a vaporizer 180a may be installed. A modifying gas (also referred to as a treatment gas) is used as the first processing gas. The modifying gas is, for example, a gas containing at least one of nitrogen (N), oxygen (O), hydrogen (H), carbon (C) and bromine (B). Specifically, the modifying gas may be a nitrogen ($N_2$) gas, a nitrous oxide (NO) gas, an ammonia ($NH_3$) gas or the like. An example in which an $NH_3$ gas is used as the first processing gas will be described below.

(Second Gas Supply Part)

The second gas supply part includes the second gas supply pipe 123a, an MFC 125 and a valve 126. A second gas supply source 123 connected to the second gas supply pipe 123a may be included in the second gas supply part. When a precursor of the second processing gas is liquid or solid, a vaporizer 180b may be installed. A film-forming gas is used as the second processing gas. For example, the film-forming gas is a gas containing at least one of silicon (Si), aluminum (Al), zirconium (Zr), hafnium (Hf), titanium (Ti) and germanium (Ge). For example, an aminosilane-based gas may be used as the film-forming gas. Specifically, examples of the aminosilane-based gas may include a butylaminosilane (BAS) gas, a bistertiary butylaminosilane (BTBAS) gas, a dimethylaminosilane (DMAS) gas, a bisdimethylaminosilane (BDMAS) gas, a trisdimethylaminosilane (3DMAS) gas, a diethylaminosilane (DEAS) gas, a bisdiethylaminosilane (BDEAS) gas, a dipropylaminosilane (DPAS) gas or a diisopropylaminosilane (DIPAS) gas.

(Inert Gas Supply Part)

The inert gas supply part includes the inert gas supply pipe 133a, an MFC 135 and a valve 136. An inert gas supply source 133 connected to the inert gas supply pipe 133a may be included in the inert gas supply part.

(Controller)

Next, a controller 280 will be described in detail with reference to FIG. 3. The substrate processing apparatus 100 includes the controller 280 for controlling the operations of respective parts of the substrate processing apparatus 100.

Figure 3:
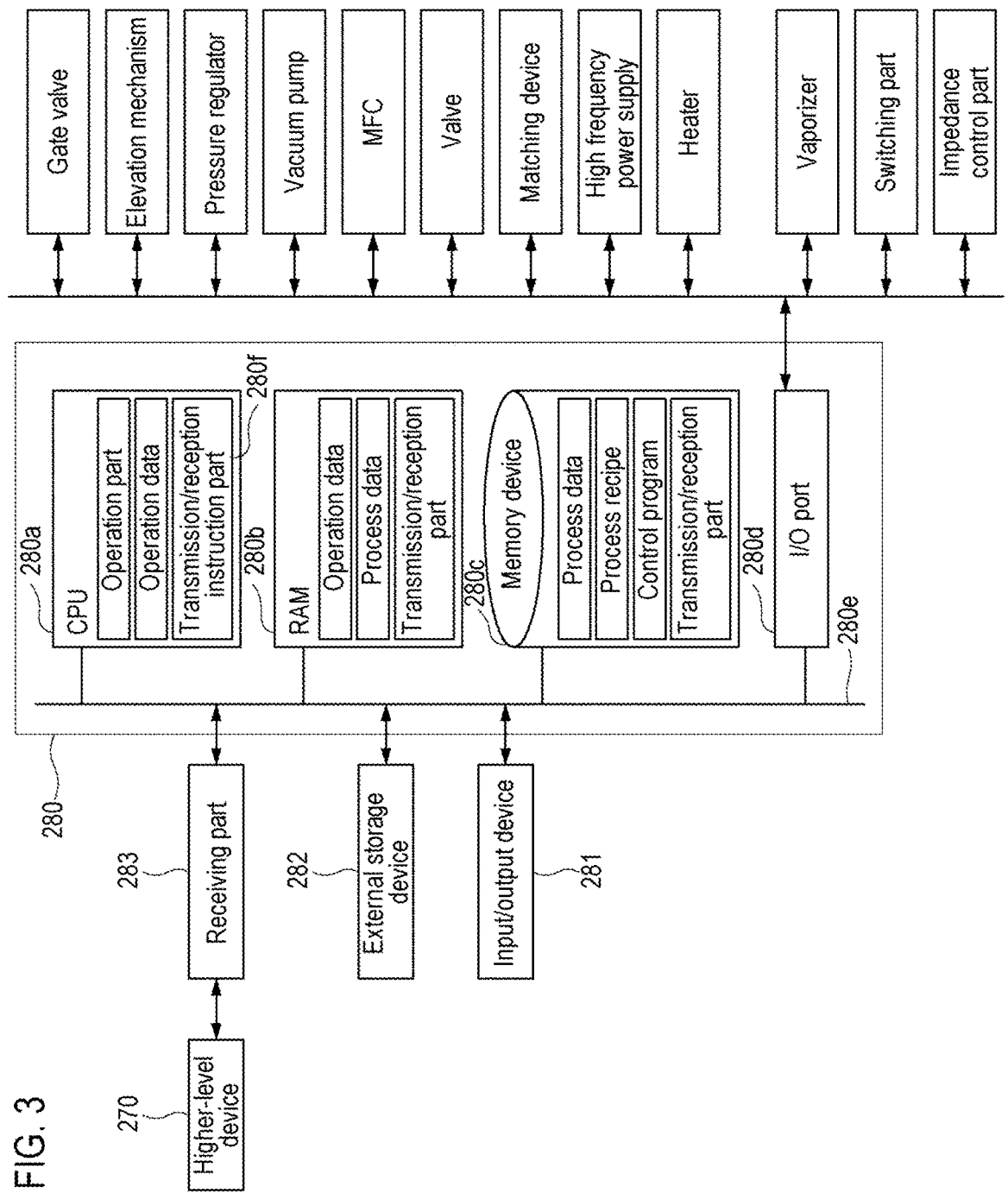
FIG. 3 is a schematic view illustrating the configuration of a controller of the substrate processing apparatus according to one embodiment.

The outline of the controller 280 is shown in FIG. 3. The controller 280, which is a control part (control means), is configured as a computer including a central processing unit (CPU) 280a, a random access memory (RAM) 280b, a memory device 280c as a storage part, and an I/O port 280d.

The RAM 280b, the memory device 280c and the I/O port 280d are configured to exchange data such as a process data and an operation data with the CPU 280a via an internal bus 280e. Transmission and reception of data inside the substrate processing apparatus 100 is performed according to an instruction provided from a transmission/reception instruction part 280f which is also one function of the CPU 280a.

An input/output device 281 formed of, e.g., a touch panel or the like, and an external storage device 282 are connected to the controller 280. In addition, a receiving part 283 connected to a higher-level device 270 via a network is installed.

The memory device 280c is configured with, for example, a flash memory, a hard disk drive (HDD) or the like. A control program for controlling the operations of the substrate processing apparatus 100, and a process recipe or a table, in which sequences and conditions of a film forming process to be described later are written, are readably stored in the memory device 280c. The process recipe functions as a program for causing the controller 280 to execute each sequence (to be described later) in the film forming process to obtain a predetermined result. Hereinafter, the process recipe and the control program will be generally and simply referred to as a "program". When the term "program" is used herein, it may indicate a case of including only the process recipe, a case of including only the control program, or a case of including both the process recipe and the control program. The RAM 280b is configured as a memory area (work area) in which a program or data read by the CPU 280a is temporarily stored.

The I/O port 121d is connected to various components of the substrate processing apparatus 100, such as the gate valve 1490, the elevating part 218, the first impedance control part 258, the second impedance control part 257, the third impedance control part 259, and so on.

The CPU 280a is configured to read and execute the control program from the memory device 280c. The CPU 280a is also configured to read the process recipe from the memory device 280c according to an operation command inputted from the input/output device 281. The CPU 280a is configured to the opening/closing operation of the gate valve 1490, the elevating operation of the elevating part 218, the On-Off control of each pump, the flow rate adjusting operation of the MFCs, the opening/closing operation of each valve, and the like, according to contents of the read process recipe. A recipe corresponding to each substrate is recorded as the process recipe. For example, a first recipe for forming a SiN film on the substrate 200 is stored and a second recipe for forming a SiO film on the substrate 200 is stored. These recipes are configured to be read out when an instruction for processing each substrate is received from a higher-level device or the like.

The controller 280 of this embodiment may be configured by installing, on a computer, the aforementioned program stored in the external storage device 282 (for example, a magnetic disc such as a hard disc, an optical disc such as a DVD, a magneto-optical disc such as an MO, a semiconductor memory such as a USB memory). Meanwhile, the means for inputting the program to the computer is not limited to the case of using the external storage device 282. For example, the program may be inputted to the computer using communication means such as the Internet or a dedicated line, instead of using the external storage device 282. The memory device 280c or the external storage device 282 is configured as a non-transitory computer-readable recording medium. Hereinafter, the memory device 280c and the external storage device 282 will be generally and simply referred to as a "recording medium." When the term "recording medium" is used herein, it may indicate a case of including only the memory device 280c, a case of including only the external storage device 282, or a case of including both the memory device 280c and the external storage device 282.

(2) Substrate Processing Step

Next, as one of various processes for manufacturing a semiconductor device, an example of flow and sequence for modifying an insulating film formed on the substrate (the wafer 200) will be described. Here, for example, a silicon-containing layer is formed as the insulating film. The silicon-containing layer is, for example, a layer containing silicon, nitrogen and impurities. Further, one of the manufacturing processes is performed by the above-described substrate processing apparatus. In the following description, the operations of various parts constituting the substrate processing apparatus are controlled by the controller 280.

In this specification, the term "substrate" is used in the same way as in the term "wafer." In this case, the "wafer" may be replaced with "substrate" in the above description.

The substrate processing step will be described below.

(Substrate Loading Step S201)

In a film forming process, first, the wafer 200 is loaded into the process space 201. Specifically, the substrate supporting part 210 is lowered by the elevating part 218 so that the lift pins 207 protrude from the upper surface of the substrate supporting part 210 through the through-holes 214. After adjusting the interior of the process space 201 and the transfer chamber 203 to have a predetermined pressure, the gate valve 1490 is opened and the wafer 200 is placed on the lift pins 207 through the gate valve 1490. After placing the wafer 200 on the lift pins 207, the gate valve 1490 is closed. The substrate supporting part 210 is raised up to a predetermined position by the elevating part 218 so that the wafer 200 is mounted on the substrate supporting part 210 from the lift pins 207.

(Depressurizing/Heating Step S202)

Subsequently, the interior of the process space 201 is evacuated via the exhaust pipe 224 so that the interior of the process space 201 has a predetermined pressure (degree of vacuum). At this time, based on a pressure value measured by a pressure sensor (not shown), a valve opening degree of the pressure regulator 227 is feedback-controlled. In addition, based on a temperature value detected by a temperature sensor (not shown), a supply amount of electric power to the heater 213 is feedback-controlled so that the interior of the process space 201 has a predetermined temperature. Specifically, the substrate supporting part 210 is heated in advance by the heater 213 and is allowed to stay for a certain period of time after a change in temperature of the wafer 200 or the substrate supporting part 210 disappears.

The temperature of the heater 213 at this time is set to be a constant temperature within a range of 100 to 600 degrees C., specifically 100 to 500 degrees C., more specifically 250 to 450 degrees C.

(First Processing Step S301)

Figure 4:
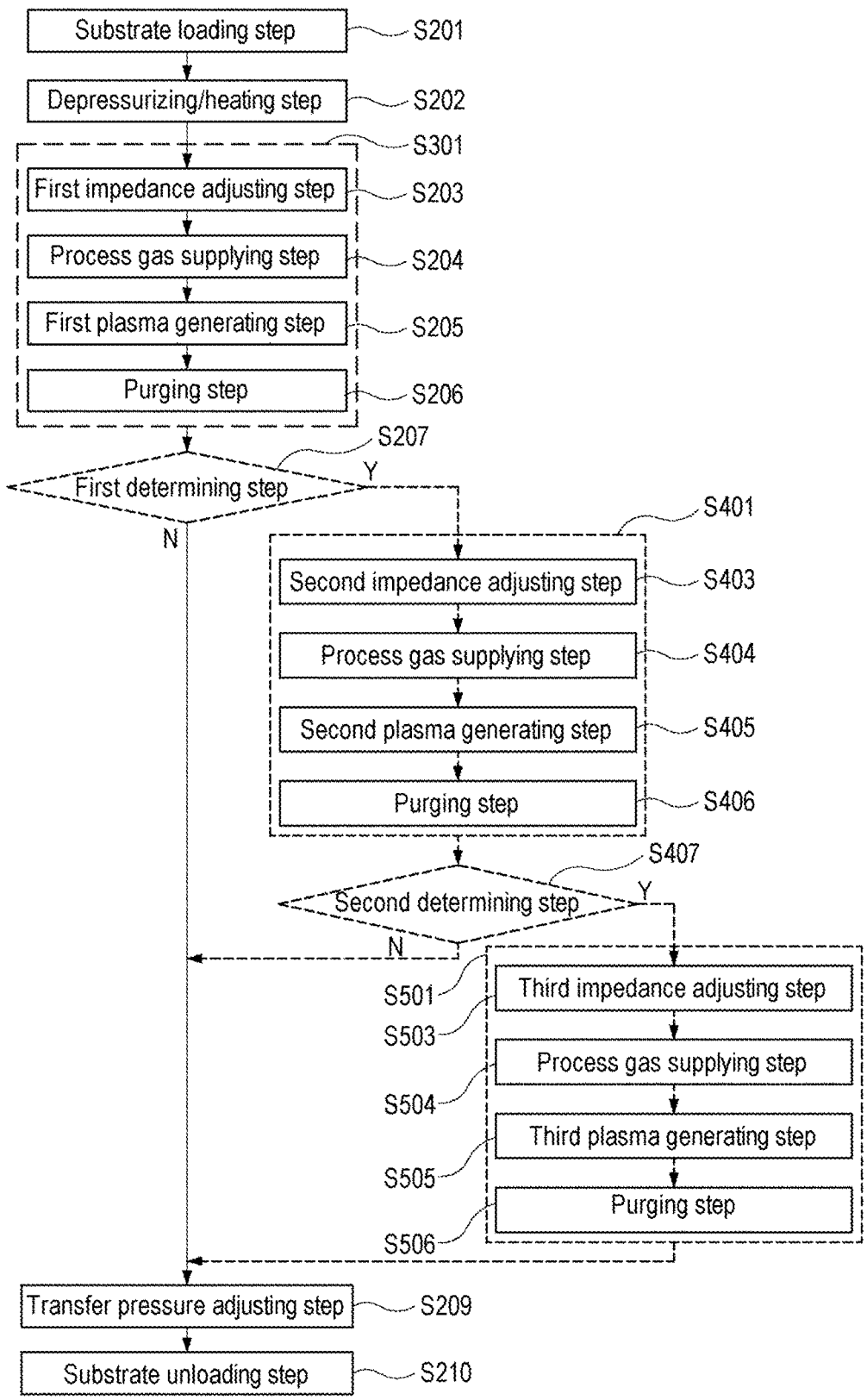
FIG. 4 is a flowchart illustrating substrate processing steps according to one embodiment.
Figure 5:
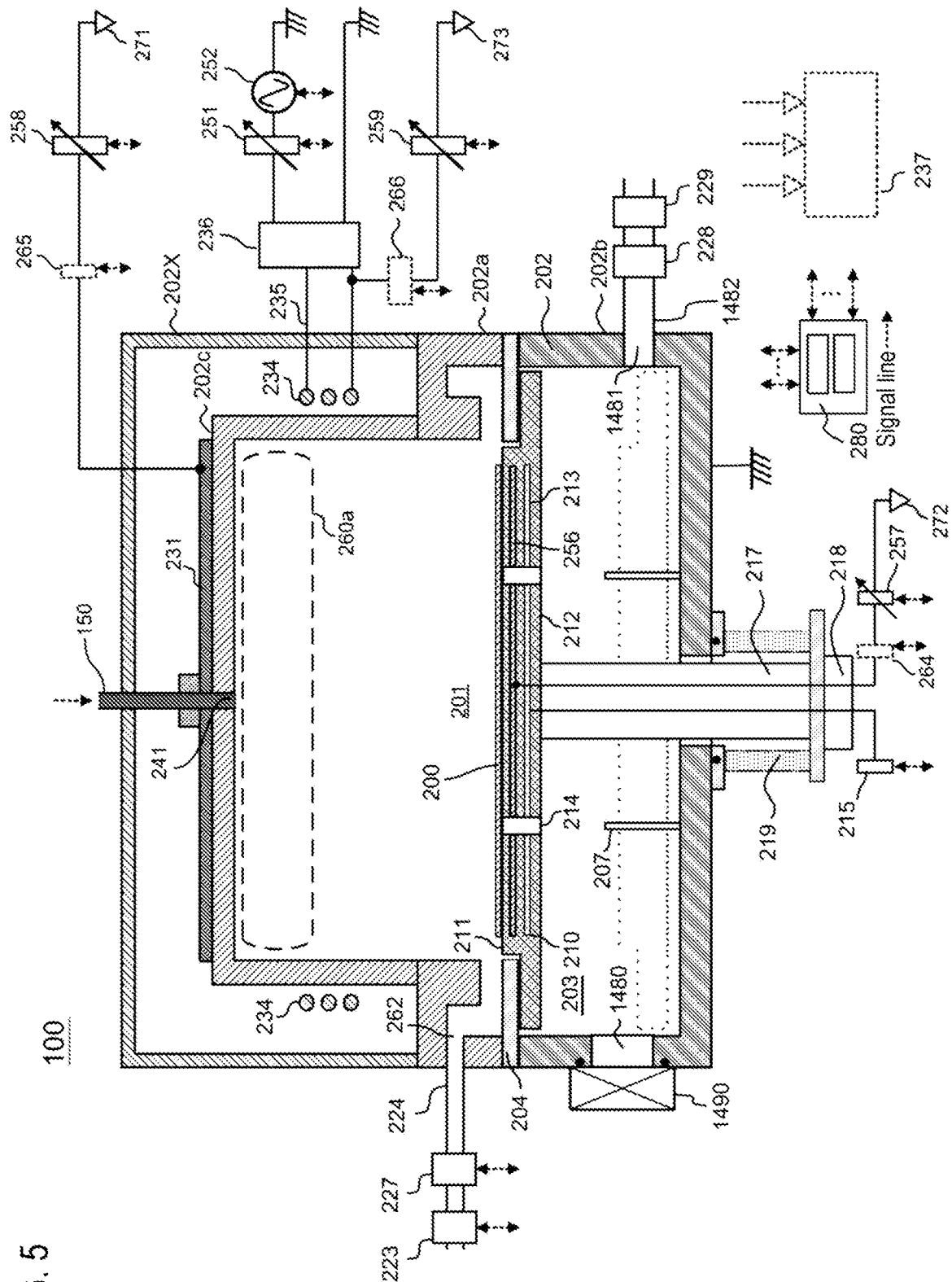
FIG. 5 is a view illustrating an example of plasma generation according to one embodiment.
Figure 6:
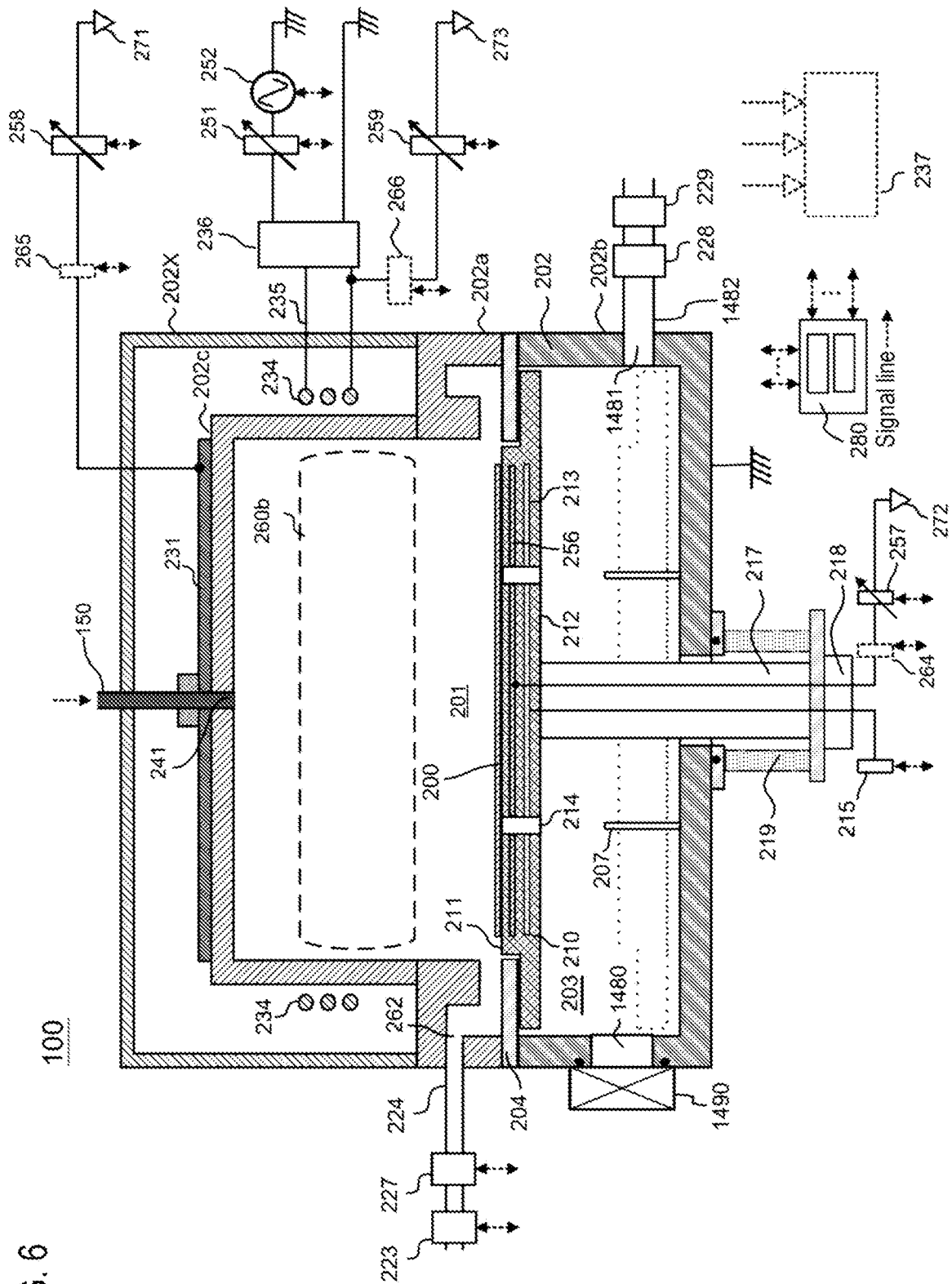
FIG. 6 is a view illustrating an example of plasma generation according to one embodiment.
Figure 7:
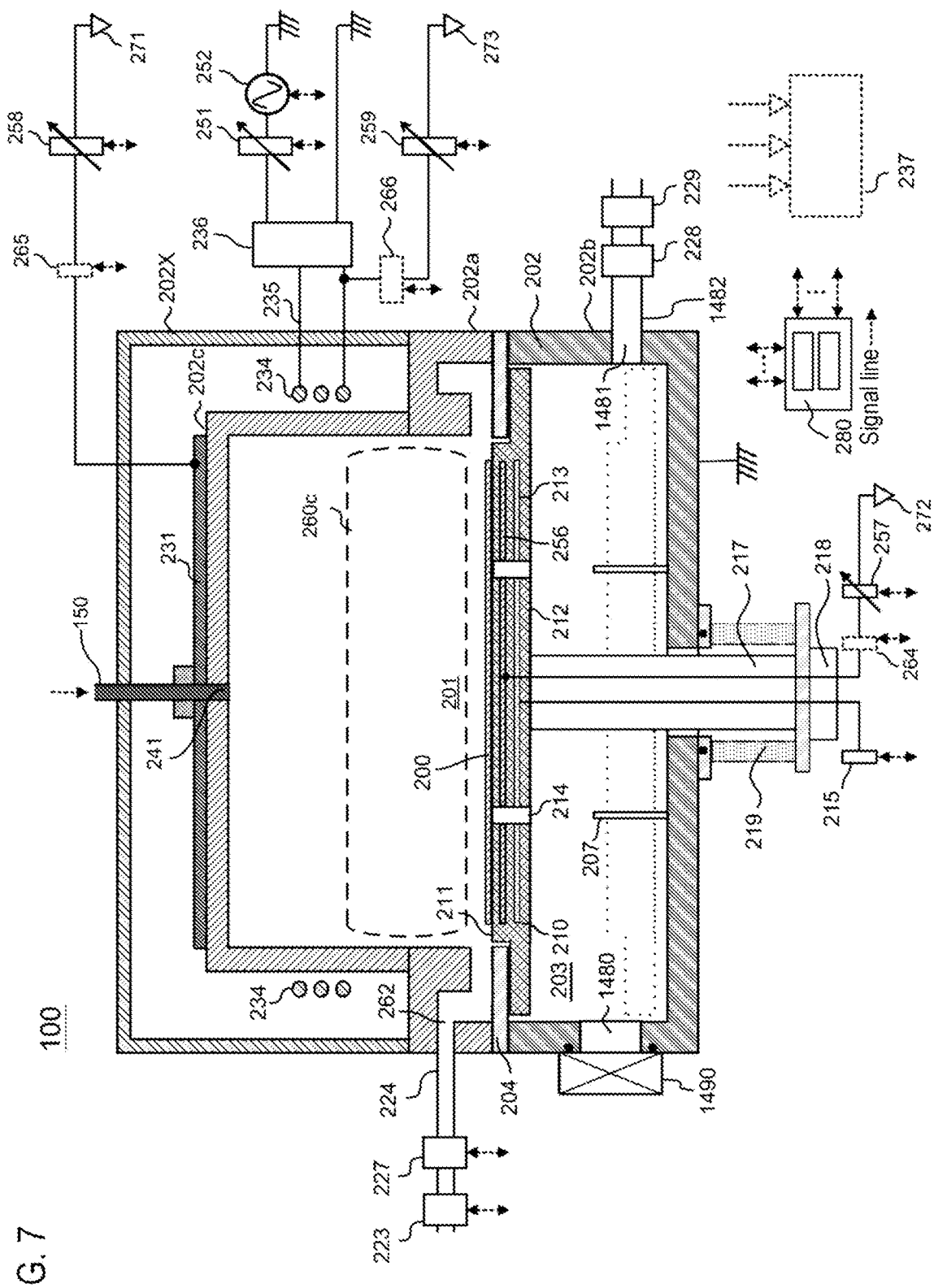
FIG. 7 is a view illustrating an example of plasma generation according to one embodiment.

Next, as a first processing step, an example in which a silicon-containing layer formed on the wafer 200 is subjected to a treatment process (also referred to as a modifying process) will be described. Details of the first processing step S301 will be described with reference to FIGS. 4, 5, 6, 7 and 8. FIG. 4 is a flowchart of the substrate processing step. FIGS. 5, 6 and 7 are views illustrating examples of plasma generation and a control relationship between the respective impedance control parts. FIG. 8 is an example of a table that lists setting values of the respective impedance control parts for plasma setting.

After the wafer 200 is mounted on the substrate supporting part 210 and the internal atmosphere of the process space 201 is stabilized, Steps S203 to S207 are performed.

(First Impedance Adjusting Step S203)

First, a first impedance adjusting step S203 of adjusting the plasma state in the vicinity of the wafer 200 or the support electrode (also referred to as a susceptor electrode) 256 is performed. Specifically, one of the first setting, the second setting and the third setting of the impedance setting table illustrated in FIG. 8 is read out. For example, the impedance setting table is recorded in the memory device 280c. The controller 280 transmits the read impedance setting to each impedance control part. Each impedance control part performs an impedance adjustment as follows. The first impedance control part 258 adjusts the impedance between the upper electrode 231 and the first potential portion 271. The second impedance control part 257 adjusts the impedance between the support electrode 256 and the second potential portion 272. The third impedance control part 259 adjusts the impedance between the electrode 234 and the third potential portion 273. In the case where the switching parts 264, 265 and 266 are installed between each electrode and each impedance control part, the controller 280 sets ON/OFF of the switching parts 264, 265 and 266. Although Step S203 has been described to be performed after Step S202, without being limited thereto, Step S203 may be performed between Step S201 and a first plasma generating step (to be described later).

(First Gas Supplying Step S204)

In a first gas supplying step S204, an $NH_3$ gas as a first processing gas is supplied from the first gas supply part into the process space 201. Specifically, the $NH_3$ gas supplied from the first gas supply source 113, the flow rate of which is adjusted by the MFC 115, is supplied into the substrate processing apparatus 100. The $NH_3$ gas of the flow rate thus adjusted is supplied from the gas introduction port 241 into the process space 201 whose interior is depressurized. In addition, the interior of the process space 201 is continuously exhausted by the exhaust system so that the internal pressure of the process space 201 is within a predetermined pressure range (first pressure). At this time, the $NH_3$ gas is supplied onto the wafer 200. The $NH_3$ gas is supplied into the process space 201 at a predetermined flow rate (e.g., 100 to 20,000 sccm) or a predetermined pressure (e.g., 10 to 1,000 Pa). In this manner, the $NH_3$ gas is supplied onto the wafer 200.

(First Plasma Generating Step S205)

With the $NH_3$ gas supplied into the process space 201 or onto the wafer 200, a low frequency power is supplied from the power supply part (the combination of the matching device 251 and the low frequency power supply 252) to the electrode 234. By supplying the low frequency power to the electrode 234, the plasma 260 of the $NH_3$ gas is generated inside the process space 201. A predetermined power (for example, 50 W or more and 10,000 W or less) is supplied to the electrode 234. The supply of such a low frequency power deteriorates the skin effect. In other words, it is possible to suppress plasma from being concentrated on the wall side of the plasma generation container 202c. As a result, it is possible to make the plasma density in the horizontal direction with respect to the wafer 200 uniform inside the process space 201.

Active species of $NH_3$ exist in the plasma. As the active species of $NH_3$ are supplied onto the wafer 200, the silicon-containing layer formed on the wafer 200 is modified.

Specifically, chlorine (Cl) contained in the silicon-containing layer is removed and nitrogen (N) is supplied to dangling bonds in the silicon-containing layer, thereby improving the quality of a silicon nitride film. Further, depending on the setting of each impedance control part, the state of the plasma 260 changes as follows. The process of the present disclosure is performed for a predetermined period of time under any one of the following plasma states or in combination thereof.

<Relationship Between Plasma State and Impedance Setting>

(For First Setting)

In the case where the impedance setting is set to the first setting, as illustrated in FIG. 5, a first plasma 260a drawn close to the upper portion of the process space 201 is generated. This happens because the impedance of a path from the upper electrode 231 to the first potential portion 271 is small and the low frequency power output from the low frequency power supply 252 easily flows toward the upper electrode 231 via the electrode 234 and the first plasma 260a. By processing the wafer 200 in the state of the first plasma 260a, it is possible to reduce the amount of ions reaching the wafer 200 and perform a relatively isotropic process on a device (also referred to as a structure or an uneven structure) formed on the wafer 200.

(For Second Setting)

In the case where the impedance setting is set to the second setting, as illustrated in FIG. 6, a second plasma 260b drawn close to the support electrode 256 is generated. This happens because the impedance of the path from the upper electrode 231 to the first potential portion 271 is close to the impedance of a path from the support electrode 256 to the second potential portion 272 and the low frequency power output from the low frequency power supply 252 flows toward both the upper electrode 231 and the support electrode 256 via the electrode 234 and the second plasma 260b. In addition, in the second setting, not all of electrons flow into the support electrode 256 but a portion of the electrons also flows into the upper electrode 231. By processing the wafer 200 in the state of the second plasma 260b, it is possible to uniformly substantially modify one layer of the film formed on the wafer 200.

(For Third Setting)

When the impedance setting is set to the third setting, as illustrated in FIG. 7, a third plasma 260c drawn close to the support electrode 256 and approaching the wafer 200 is generated. This happens because the impedance of the path from the support electrode 256 to the second potential portion 272 is small and the low frequency power outputted from the low frequency power supply 252 easily flows toward the support electrode 256 via the antenna 234 and the third plasma 260c. The plasma density in the vicinity of the support electrode 256 is higher than that in the second setting. By processing the wafer 200 in the state of the third plasma 260c, it is possible to increase a modification rate of the film formed on the wafer 200.

Here, the plasma generation will be described by taking as an example a case where a second processing step S401 and a third processing step S501 to be described later are performed. In this case, a process in the state in which the first plasma 260a is generated is performed to the extent that the entire surface of the wafer 200 is covered with nitrogen by about several atomic layers.

(Purging Step S206)

After the silicon-containing layer on the wafer 200 is modified, the gas valve 116 of the first gas supply pipe 113a is closed to stop the supply of the NH$_3$ gas. By stopping the supply of the first gas, the first gas existing in the process space 201 is exhausted from the first exhaust part to perform a purging step S206.

In the purging step S206, in addition to the discharge of the gas through the simple exhaust (evacuation) of the gas, an inert gas may be supplied from the inert gas supply source 133 to push out and discharge the remaining gas. In this case, the valve 136 is opened and the flow rate of the inert gas is adjusted by the MFC 135. In some embodiments, the evacuation and the supply of the inert gas may be performed in combination. Alternatively, the evacuation and the supply of the inert gas may be alternately performed.

After a predetermined period of time, the valve 136 is closed to stop the supply of the inert gas. The supply of the inert gas may be continued with the valve 136 opened. The supply flow rate of the N$_2$ gas as a purge gas supplied from the inert gas supply part is set to fall within a range of, for example, 100 to 20,000 sccm. As the purge gas, in addition to the N$_2$ gas, a noble gas such as Ar, He, Ne, Xe or the like may be used.

(First Determining Step S207)

After the completion of the purging step S206, the controller 280 may determine whether or not it is necessary to perform another process in addition to the above-described first processing step S301 (Steps S203 to S206). That is to say, the controller 280 may determine whether or not the modification of the film or structure formed on the wafer 200 has ended.

In a first determining step S207, the following determination is made. If it is determined that it is necessary to perform another process in addition to the first processing step S301 ("Y" in the first determining step S207), a second processing step S401 is performed. If it is determined that it is unnecessary to perform another process ("N" in the first determining step S207), the first processing step S301 is ended and a transfer pressure adjusting step S209 and a substrate unloading step S210 to be described later are executed.

In a case where the first determining step S207 is not performed, after the first processing step S301, the transfer pressure adjusting step S209 and the substrate unloading step S210 are executed.

(Second Processing (Treatment) Step S401)

Next, an example in which the wafer 200 is subjected to a second process will be described.

(Second Impedance Adjusting Step S403)

In the second process, first, the impedance of each impedance control part is adjusted. In Step S403, the impedance setting is adjusted unlike that of the first impedance adjusting step S203. Specifically, if it is adjusted to the first setting in Step S203, the impedance setting in Step S403 is adjusted to the second setting or the third setting. Here, a case where the impedance setting is adjusted to the first setting in the first processing step S301 and is adjusted to the second setting in the second processing step S401 will be described. After it is adjusted to the second impedance, a processing gas supplying step S404, a second plasma generating step S405 and a purging step S406 to be described later are performed. The processing gas supplying step S404 and the purging step S406 performed here are the same as the above-described processing gas supplying step S204 and purging step S206 and therefore, explanation of which will not be repeated.

(Second Plasma Generating Step S405)

Similar to the above-described first plasma generating step S205, a low frequency power is supplied to the electrode 234 to thereby generate plasma of an NH$_3$ gas inside the process space 201. At this time, as the plasma, the second plasma 260b is generated as described above.

After the plasma is generated and after a predetermined period of time elapses, the purging step S406 is performed and the second processing step S401 is ended.

Such a process is effective, for example, for a wafer 200 on which an electrode structure or a metal-containing film is exposed or a wafer 200 in which a metal-containing film is present at a position relatively close to the surface of the wafer 200. The metal-containing film may be charged up by contact with the plasma 260. In the case of the charge-up, there is a possibility of dielectric breakdown of an insulating film formed around the metal-containing film. This dielectric breakdown is called a charge-up damage. This raises a problem of a decrease in a yield of semiconductor device production. However, by performing the first processing step S301 in this way, it is possible to insulate the outermost surface of the electrode structure or the metal-containing film. Thus, with the charge-up suppressed, a process by the third plasma 260c containing ion components can be performed, thereby increasing the modification rate of the above-described silicon-containing film.

A second determining step S407 may be performed after the second processing step S401.

(Second Determining Step S407)

In the second determining step S407, it is determined whether or not it is necessary to perform another process as in the first determining step S207. If it is determined that it is necessary to perform another process ("Y" in the second determining step S407), a third processing step S501 is performed. If it is determined that it is unnecessary to perform another process ("N" in the second determining step S407), the second processing step S401 is ended and the transfer pressure adjusting step S209 and the substrate unloading step S210 to be described later are executed.

In a case where the second determining step S407 is not performed, after the second processing step S401, the transfer pressure adjusting step S209 and the substrate unloading step S210 are executed.

(Third Processing (Treatment) Step S501)

Next, an example in which the wafer 200 is subjected to a third process will be described.

(Third Impedance Adjusting Step S503)

In the third process, first, the impedance of each impedance control part is adjusted. In Step S503, the impedance setting is adjusted unlike those of the first impedance adjusting step S203 and the second impedance adjusting step S403. Specifically, in the case where the impedance setting is adjusted to the first setting in Step S203 and is adjusted to the second setting in Step S403, the impedance setting in Step S503 is adjusted to the third setting. Here, a case where the impedance setting is adjusted to the first setting in Step S203, the second setting in Step S403, and the third setting in Step S503 will be described. After the adjustment to the third impedance, a processing gas supplying step S504, a third plasma generating step S505 and a purging step S506 to be described later are performed. The processing gas supplying step S504 and the purging step S506 performed here are the same as the above-described processing gas supplying step S204 and purging step S206 and therefore, explanation of which will not be repeated.

(Third Plasma Generating Step S505)

Similar to the above-described first plasma generating step S205 and second plasma generating step S405, a low frequency power is supplied to the electrode 234 to thereby generate plasma of an $NH_3$ gas inside the process space 201.

At this time, as the plasma, the third plasma 260c is generated as described above.

After the plasma is generated and after a predetermined period of time elapses, the purging step S506 is performed and the third processing step S501 is ended.

By performing the modifying process in three stages in this manner, it is possible to maximize the modification rate of the silicon-containing layer while shortening the formation time of a layer for suppressing the charge-up. In the case where the metal-containing film is exposed on the surface of the wafer 200, since the amount of ion components reaching the wafer 200, which affects the modification rate, is proportional to the amount of charge-up, it is possible to suppress the charge-up when the surface of the metal-containing film is insulated (passivated) or when no insulating film is formed on the surface.

After the third processing step S501, the transfer pressure adjusting step S209 and the substrate unloading step S210 are performed.

(Transfer Pressure Adjusting Step S209)

Next, the transfer pressure adjusting step S209 will be described. In the transfer pressure adjusting step S209, the interior of the process space 201 and the interior of the transfer chamber 203 are exhausted from one or both of the first exhaust port 262 and the second exhaust port 1481 so as to have a predetermined pressure (degree of vacuum).

(Substrate Unloading Step S210)

After the interior of the process space 201 and the interior of the transfer chamber 203 reaches the predetermined pressure in the transfer pressure adjusting step S209, the substrate supporting part 210 is lowered by the elevating part 218 so that the lift pins 207 protrude from the upper surface of the substrate supporting part 210 through the through-holes 214. That is to say, the wafer 200 is supported by the lift pins 207. Thereafter, the gate valve 1490 is opened and the wafer 200 is unloaded from the transfer chamber 203 to a transfer module (not shown).

In this manner, the substrate processing step of the present disclosure is performed.

Although one embodiment of the present disclosure has been particularly described above, the present disclosure is not limited to the above-described embodiment but various modifications can be made without departing from the spirit and scope of the present disclosure.

Although a method of supplying and processing one kind of gas has been described above, a process using two or more kinds of gases may be performed.

In addition, although the modifying process has been described above, it is also applicable to other processes such as diffusion, oxidation, nitridation, oxynitridation, reduction, oxidation reduction, etching, heating, film formation and the like using plasma. After performing these processes, the above-described first to third processes may be performed.

In addition, although the example in which the modifying process is performed in a state where the silicon-containing layer is already formed on the wafer 200 has been described above, the modifying process may be performed during the formation of the silicon-containing layer. Specifically, in a process of cyclically supplying a silicon-containing gas from the second gas supply part and a nitrogen-containing gas from the first gas supply part to form a silicon-containing layer, the above-described first process may be performed every cycle or every several cycles. In addition, during a cycle of forming the silicon-containing layer, a low frequency power may be supplied while supplying a nitrogen-containing gas from the first gas supply part. Such a process can improve the quality of a silicon nitride film. These process sequences are illustrated in FIG. 9. Among the above-described substrate processing steps, each of the first processing step S301, the second processing step S401 and the third processing step S501 may be replaced by a fourth processing step S601 and a fifth processing step S701 illustrated in FIG. 9. Specifically, the first processing step S301 may be replaced with the fifth processing step S701 and the second processing step S401 may be performed after the step of forming the silicon-containing layer. According to a combination of such film formation and modifying process, it is possible to perform film formation and modification more uniformly on a substrate having a high aspect pattern than in the above embodiment.

In addition, although the process of manufacturing a semiconductor device has been described above, the present disclosure may be applied to processes other than the semiconductor device manufacturing process. For example, the present disclosure may be applied to substrate processes such as a liquid crystal device manufacturing process, a solar cell manufacturing process, a light emitting device manufacturing process, a glass substrate processing step, a ceramic substrate processing step, a conductive substrate processing step and the like.

In addition, although the example in which the silicon nitride film is formed using the nitrogen-containing gas as the processing gas has been described above, the present disclosure may be applied to film formation using other gases such as an oxygen-containing gas, a carbon-containing gas, a boron-containing gas, a metal-containing gas, a gas containing two or more of these elements, and the like.

Further, although the example in which the silicon-containing layer is processed has been described above, the present disclosure may be applied to layers containing other elements, such as an Al-containing layer, a Zr-containing layer, a Hf-containing layer, a HfAl-containing layer, a ZrAl-containing layer, a SiC-containing layer, a SiCN-containing layer, a SiBN-containing layer, a TiN-containing layer, a TiC-containing layer, a TiAlC-containing layer and the like.

Moreover, although the configuration of the apparatus for processing one sheet of substrate in a single processing chamber has been described above, the present disclosure is not limited thereto but may be applied to apparatuses in which plural sheets of substrates are arranged in a horizontal direction.

According to the present disclosure in some embodiments, it is possible to generate a large amount of active species in a plasma process for changing the characteristics of a processed film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a processing container in which a substrate is accommodated;
   a substrate supporting part configured to support the substrate inside the processing container and including a support electrode;
   an upper electrode installed to face the substrate supporting part;
   a first impedance control part having one end connected to the upper electrode;
   a second impedance control part having one end connected to the support electrode;
   a processing gas supply part configured to supply a processing gas to the substrate;
   an activation part configured to activate the processing gas, the activation part being installed outside the processing container and being connected to a power supply part via an insulating part; and
   a third impedance control part having one end connected between the insulating part and the activation part.

2. The substrate processing apparatus of claim 1, further comprising: a first potential portion connected to another end of the first impedance control part and having a potential different from an earth potential; a second potential portion connected to another end of the second impedance control part and having a potential different from the earth potential; and a third potential portion connected to another end of the third impedance control part and having a potential different from the earth potential.

3. The substrate processing apparatus of claim 2, further comprising: a common potential portion to which the first potential portion, the second potential portion and the third potential portion are connected.

4. The substrate processing apparatus of claim 1, further comprising: a control part configured to set a first impedance of the first impedance control part, a second impedance of the second impedance control part, a third impedance of the third impedance control part, and a power of the power supply part.

5. The substrate processing apparatus of claim 2, further comprising: a control part configured to set a first impedance of the first impedance control part, a second impedance of the second impedance control part, a third impedance of the third impedance control part, and a power of the power supply part.

6. The substrate processing apparatus of claim 3, further comprising: a control part configured to set a first impedance of the first impedance control part, a second impedance of the second impedance control part, a third impedance of the third impedance control part, and a power of the power supply part.

7. The substrate processing apparatus of claim 4, wherein the control part controls the first impedance control part, the second impedance control part, the third impedance control part, the activation part and the power supply part such that the setting of the impedance is set to a first setting in which the second impedance is larger than the first impedance and the third impedance, and the power is supplied to the activation part to activate the processing gas.

8. The substrate processing apparatus of claim 5, wherein the control part controls the first impedance control part, the second impedance control part, the third impedance control part, the activation part and the power supply part such that the setting of the impedance is set to a first setting in which the second impedance is larger than the first impedance and the third impedance, and the power is supplied to the activation part to activate the processing gas.

9. The substrate processing apparatus of claim 6, wherein the control part controls the first impedance control part, the second impedance control part, the third impedance control part, the activation part and the power supply part such that the setting of the impedance is set to a first setting in which the second impedance is larger than the first impedance and the third impedance, and the power is supplied to the activation part to activate the processing gas.

10. The substrate processing apparatus of claim 4, wherein the control part controls the first impedance control part, the second impedance control part, the third impedance control part, the activation part and the power supply part such that the setting of the impedance is set to a second setting in which the first impedance and the second impedance are larger than the third impedance, and the power is supplied to the activation part to activate the processing gas.

11. The substrate processing apparatus of claim 7, wherein the control part controls the first impedance control part, the second impedance control part, the third impedance control part, the activation part and the power supply part such that the setting of the impedance is set to a second setting in which the first impedance and the second impedance are larger than the third impedance, and the power is supplied to the activation part to activate the processing gas.

12. The substrate processing apparatus of claim 4, wherein the control part controls the first impedance control part, the second impedance control part, the third impedance control part, the activation part and the power supply part such that the setting of the impedance is set to a third setting in which the first impedance is larger than the second impedance and the third impedance, and the power is supplied to the activation part to activate the processing gas.

13. The substrate processing apparatus of claim 7, wherein the control part controls the first impedance control part, the second impedance control part, the third impedance control part, the activation part and the power supply part such that the setting of the impedance is set to a third setting in which the first impedance is larger than the second impedance and the third impedance, and the power is supplied to the activation part to activate the processing gas.

14. The substrate processing apparatus of claim 10, wherein the control part controls the first impedance control part, the second impedance control part, the third impedance control part, the activation part and the power supply part such that the setting of the impedance is set to a third setting in which the first impedance is larger than the second impedance and the third impedance, and the power is supplied to the activation part to activate the processing gas.

15. The substrate processing apparatus of claim 14, wherein the control part controls the substrate to be subjected a first process with a first setting, and subsequently, a second process with the second setting or a third process with the third setting.

* * * * *